(12) United States Patent
Araki

(10) Patent No.: US 6,621,840 B2
(45) Date of Patent: Sep. 16, 2003

(54) ORGANIC LIGHT-EMITTING DEVICE

(75) Inventor: Yasushi Araki, Kanagawa-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 82 days.

(21) Appl. No.: 09/813,997

(22) Filed: Mar. 22, 2001

(65) Prior Publication Data

US 2002/0067749 A1 Jun. 6, 2002

(30) Foreign Application Priority Data

Mar. 22, 2000 (JP) .................................. 2000-080209

(51) Int. Cl.$^7$ ................................................ H01S 3/14
(52) U.S. Cl. .................... 372/39; 313/506; 428/690; 428/917
(58) Field of Search .................. 372/39; 313/506; 428/917, 690; 257/79, 88

(56) References Cited

U.S. PATENT DOCUMENTS

| | | | | |
|---|---|---|---|---|
| 5,405,710 A | * | 4/1995 | Dodabalapur et al. | ...... 313/506 |
| 5,814,416 A | * | 9/1998 | Dodabalapur et al. | ...... 428/690 |
| 6,211,613 B1 | * | 4/2001 | May | ...... 313/506 |
| 6,330,262 B1 | * | 12/2001 | Burrows et al. | ...... 372/39 |

FOREIGN PATENT DOCUMENTS

JP    11-288786 A    10/1999

* cited by examiner

*Primary Examiner*—Albert W. Paladini
(74) *Attorney, Agent, or Firm*—Burns, Doane, Swecker & Mathis, LLP

(57) ABSTRACT

A micro-optical resonator type organic light-emitting device comprising a substrate, and a multi-layered thin film, a transparent electrode, an organic light-emitting layer and a back electrode disposed on the substrate. If 0-mode resonance wavelength of the organic light-emitting device is expressed by $\lambda_0$, n-mode resonance wavelength of the organic light-emitting device is expressed by $\lambda_n$ (in which n is a positive integer) and reflectivity of the multi-layered thin film against light having a wavelength $\lambda$ is expressed by $R(\lambda)$, $R(\lambda_0)$ is 40% or more and $R(\lambda_1)$ or $R(\lambda_2)$ is 30% or less.

21 Claims, 1 Drawing Sheet

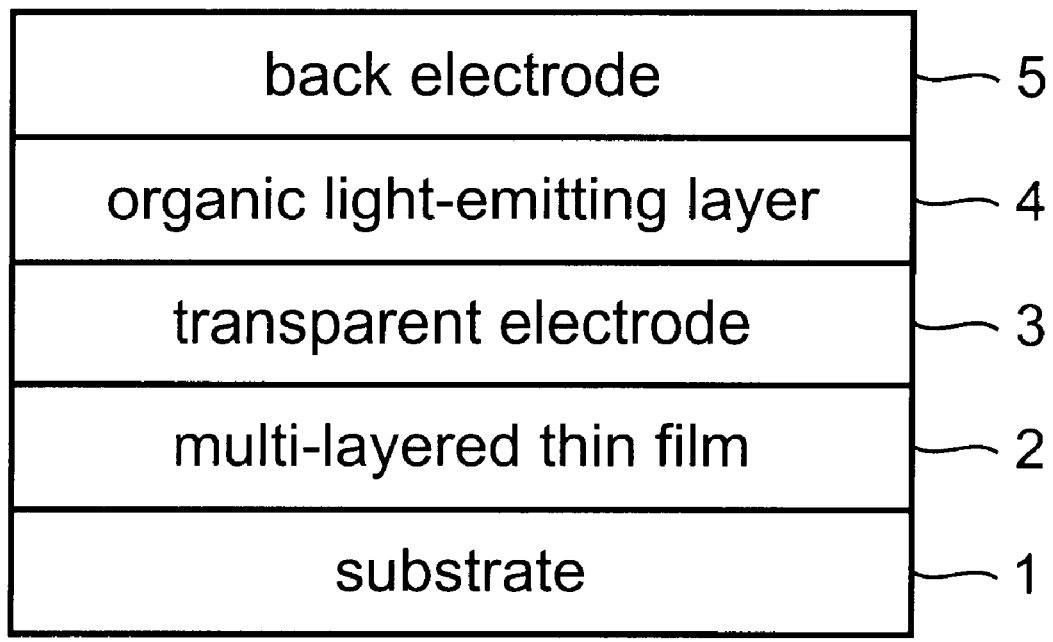

ORGANIC LIGHT-EMITTING DEVICE

BACKGROUND OF THE INVENTION

The present invention relates to an organic light-emitting device.

Organic light-emitting devices generally act as a light source that perfectly diffuses light, thereby suffering remarkable loss in light quantity when they are used for liquid crystal projectors, optical communication devices, light-exposing devices of printers, etc. It is thus desired to develop an organic light-emitting device excellent in light emission directivity, and some proposals have been made therefor. For example, Japanese Patent Laid-Open No. 9-180883 disclosed a micro-optical resonator type organic light-emitting device, which controls emitting quantity of light other than those in directions perpendicular to a substrate to a low level, thereby exhibiting excellent light emission directivity. This micro-optical resonator type organic light-emitting device has a micro-optical resonator provided by disposing an organic layer between a conductive multi-layered mirror and a metal mirror, and has a resonance wavelength shorter than a peak wavelength in its emission spectrum.

In the above-mentioned micro-optical resonator type organic light-emitting device, it is desired that optical length thereof is as short as possible to obtain single mode resonance. Though the optical length of the device may be controlled by changing the thickness of the organic layer or the electrode of ITO (Indium Tin Oxide), etc., the organic layer cannot be changed so much in its thickness as to control the optical length to desirable level practically, so that the optical length is generally shortened by reducing the thickness of the electrode. However, when the thickness of the electrode is reduced, surface resistance of the electrode is unavoidably increased, whereby the organic light-emitting device comprising the electrode is poor in light-emitting characteristics, durability, etc.

Further, though Japanese Patent Laid-Open No. 11-288786 disclosed a micro-optical resonator type organic light-emitting device having optical length that is increased to lower surface resistance of ITO electrode, this device is disadvantageous in that multi mode resonance is often obtained.

OBJECT AND SUMMARY OF THE INVENTION

An object of the present invention is to provide a micro-optical resonator type organic light-emitting device that scarcely causes multi mode resonance even if optical length thereof is increased by thickening a transparent electrode.

As a result of intense research in view of the above object, the inventor has found that a micro-optical resonator type organic light-emitting device comprising a multi-layered thin film having particular light reflectivity scarcely causes multi mode resonance. The present invention has been accomplished by the finding.

Thus, a micro-optical resonator type organic light-emitting device of the present invention comprises a substrate, and a multi-layered thin film, a transparent electrode, an organic light-emitting layer and a back electrode disposed on the substrate, and if 0-mode resonance wavelength of the device is expressed by $\lambda_0$, n-mode resonance wavelength of the device is expressed by $\lambda_n$ (in which n is a positive integer) and reflectivity of the multi-layered thin film against light having a wavelength $\lambda$ is expressed by $R(\lambda)$, $R(\lambda_0)$ is 40% or more and $R(\lambda_1)$ or $R(\lambda_2)$ is 30% or less.

In the micro-optical resonator type organic light-emitting device of the present invention, $R(\lambda_0)$ is preferably 60% or more, more preferably 80% or more. $R(\lambda_1)$ and $R(\lambda_2)$ is preferably 30% or less. Further, it is more preferable that $R(\lambda_1)$ and/or $R(\lambda_2)$ is 20% or less, and it is particularly preferable that $R(\lambda_1)$ and/or $R(\lambda_2)$ is 10% or less.

The multi-layered thin film is preferably made of one or more material selected from the group consisting of $SiO_2$, $TiO_2$, $Al_2O_3$, $MgF_2$ and $ZrO_2$. The multi-layered thin film is preferably composed of eight or more layers. Optical length of the organic light-emitting device is particularly preferably four times or more as long as half of the wavelength $\lambda_0$. Further, the transparent electrode preferably has surface resistance of 50 $\Omega$/square or less. Thickness of the transparent electrode is preferably 40 nm or more, more preferably 80 nm or more.

BRIEF DESCRIPTION OF THE DRAWING

The FIGURE shows one embodiment of the present invention.

DETAILED DESCRIPTION OF THE PREFERRED EMBODIMENTS

A micro-optical resonator type organic light-emitting device of the present invention as shown in the FIGURE comprises a substrate 1, and a multi-layered thin film 2, a transparent electrode 3, an organic light-emitting layer 4 and a back electrode 5 disposed on the substrate. The transparent electrode acts as a positive electrode and the back electrode acts as a negative electrode generally. The transparent electrode may be a negative electrode, and in this case, the back electrode is a positive electrode.

In the present invention, 0-mode resonance wavelength of the organic light-emitting device is expressed by $\lambda_0$, n-mode resonance wavelength of the organic light-emitting device is expressed by $\lambda_n$ (in which n is a positive integer) and reflectivity of the multi-layered thin film against light having a wavelength $\lambda$ is expressed by $R(\lambda)$. Further, light having the wavelength $\lambda_0$ is referred to as "0-mode light", light having the wavelength $\lambda_1$ is referred to as "first mode light", and likewise, lights having any of the wavelengths $\lambda_2$, $\lambda_3$, ..., $\lambda_n$ are referred to as "second mode light", "third mode light", ..., "n-mode light", respectively.

In general, it is preferable that the lights other film the 0-mode light do not resonate. In this invention, $R(\lambda_0)$ is 40% or more and $R(\lambda_1)$ or $R(\lambda_2)$ is 30% or less. $R(\lambda_0)$ is preferably 60% or more, more preferably 80% or more. $R(\lambda_1)$ and $R(\lambda_2)$ is preferably 30% or less. Further, it is more preferable that $R(\lambda_1)$ and/or $R(\lambda_2)$ is 20% or less, and it is particularly preferable that $R(\lambda_1)$ and/or $R(\lambda_2)$ is 10% or less. Though $R(\lambda_3)$, $R(\lambda_4)$, ..., $R(\lambda_n)$ is desired to be 30% or less as well as $R(\lambda_1)$ and/or $R(\lambda_2)$, the three or more mode lights are generally remarkably poor in the light intensity to be negligible.

The multi-layered thin film used in the present invention may be formed by laminating two kinds of materials, which are generally a high refractive material and a low refractive material, alternatively, and may be disposed on the transparent electrode side surface of the substrate. The material for the multi-layered thin film is not particularly limited, preferably selected from the group consisting of $SiO_2$, $TiO_2$, $Al_2O_3$, $MgF_2$ and $ZrO_2$. Metals and polymers may also be used as the material.

The laminating structure of the multi-layered thin film is not particularly limited, and examples thereof include: a structure where two layers, each having a thickness set at ¼ of the wavelength $\lambda_0$ are laminated alternatively; a structure where a layer having a thickness set at ⅛ of the wavelength $\lambda_0$ and a layer having a thickness set at ¼ of the wavelength $\lambda_0$ are laminated alternatively; a structure where a layer having a thickness set at ¼ of the wavelength $\lambda_0$ and a layer having a thickness set at ¾ of the wavelength $\lambda_0$ are laminated alternatively; combination thereof, etc. The multi-layered thin film is preferably composed of eight or more layers to comparatively easily control the reflectivity $R(\lambda)$. When the multi-layered thin film is composed of less than eight layers, it is difficult to control the $R(\lambda_0)$, $R(\lambda_1)$ and $R(\lambda_2)$.

Optical length L of the micro-optical resonator type organic light-emitting device according to the present invention is expressed by the following equation taking account of optical length from the back electrode to the multi-layered thin film and penetration of light into the multi-layered thin film:

$$L = \frac{\lambda}{2}\left(\frac{n_{\mathit{eff}}}{\Delta n}\right) + \sum n_i d_i \cos\theta$$

wherein $\lambda_0$ is 0-mode resonance wavelength; $n_{\mathit{eff}}$ is effective refractive index of the multi-layered thin film; $\Delta n$ is difference of refractive indexes of the two layers composing the multi-layered thin film; $n_i$ is refractive index of the organic layer and the transparent electrode; $d_i$ is thickness of the organic layer and the transparent electrode; and $\theta$ is the angle between the light incidence and normal line of an interface between the organic layers or the organic layer and the transparent electrode.

To make the 0-mode light resonate, the optical length L is demanded to be integral multiplication of half of the wavelength $\lambda_0$. In this case, each high mode light is obtained at a frequency interval $\Delta f$ represented by the following equation:

$$\Delta f = \frac{2\pi}{2L \times \frac{\partial \beta}{\partial f}}$$

wherein $\beta$ is a propagation constant of light; and f is frequency of light.

In the case of the longer optical length, the high mode lights are generated nearer to the 0-mode light with a higher light intensity, whereby the high mode lights are demanded to be inhibited more strictly. Thus, the longer the optical length L is, the more remarkably the advantageous effect of the present invention is obtained. The optical length L of the organic light-emitting device according to the present invention is preferably two times or more, more preferably three times or more, particularly preferably four times or more, the most preferably five times or more as long as half of the wavelength $\lambda_0$.

Because the optical length may be increased in the present invention, the transparent electrode may be thickened to reduce the surface resistance thereof, thereby improving durability, light-emitting characteristics, etc. of the organic light-emitting device. The surface resistance of the transparent electrode is preferably 50 Ω/square or less, more preferably 20 Ω/square or less, particularly preferably 10 Ω/square or less. The thickness of the transparent electrode is preferably 40 nm or more, more preferably 80 nm or more, furthermore preferably 150 nm or more, particularly preferably 250 nm or more, the most preferably 350 nm or more.

The micro-optical resonator type organic light-emitting device of the present invention preferably has a laminated structure disposed on the substrate having the multi-layered thin film. Specific examples of the structure include: transparent electrode/organic light-emitting layer/back electrode; transparent electrode/organic light-emitting layer/electron-transporting layer/back electrode; transparent electrode/hole-transporting layer/organic light-emitting layer/electron-transporting layer/back electrode; the reversed structure thereof; etc. A hole-injecting layer, an electron-injecting layer, etc. may be further disposed in the device. Further, the organic light-emitting device may comprise a plurality of the hole-transporting layers, the organic light-emitting layers, the electron-transporting layers, etc. Furthermore, an electrically conductive polymer layer may be disposed on the organic light-emitting layer side surface of the transparent electrode, and a block layer is preferably disposed on the back electrode side surface of the organic light-emitting layer to prevent holes from penetrating into the back electrode.

The organic layer in the organic light-emitting device of the present invention may be provided by a known method such as a vacuum vapor deposition method, a sputtering method, a dipping method, a spin-coating method, a casting method, a bar-coating method, a roll-coating method, etc. A plurality of the organic layers may be multi layer-coated while appropriately selecting a solvent for each layer. The inorganic layer such as the electrode may be provided by a known method such as a vacuum vapor deposition method, a sputtering method, an ion-plating method, etc.

The electrodes may be patterned by a chemical etching method such as a photolithography, a physical etching method using laser, etc. Also, the patterned electrode may be provided by vacuum vapor deposition, sputtering, etc. while masking.

The micro-optical resonator type organic light-emitting device may be used as a single picture element or as a dot array where a plurality of picture elements are arranged in lines each corresponding to an emitting color, and is preferably used as the dot array. In the dot array, the picture elements of each color may form one line or a plurality of lines. The picture element is preferably 10 to 500 µm, more preferably 50 to 300 µm in size.

The contents in the micro-optical resonator type organic light-emitting device of the present invention will be described in detail below.

(A) Substrate

In the present invention, used as a material for the substrate may be a plastic or a glass. It is preferable that the plastic used for the substrate is excellent in heat resistance, dimensional stability, solvent resistance, electrical insulating properties and processing characteristics, and low in gas permeability and moisture adsorption. Examples of the plastic used for the substrate include polyethylene terephthalate, polybutylene terephthalate, polyethylene naphthalate, polystyrene, polycarbonate, polyethersulfone, polyarylate, allyldiglycol carbonate, polyimide, polycyclolefin, etc.

On one or both surface of the substrate is preferably disposed a moisture permeation-inhibiting layer and/or a gas barrier layer. Such layers are preferably made of an inorganic compound such as silicon nitride, silicon oxide and non-alkali grasses. The moisture permeation-inhibiting layer and the gas barrier layer may be provided by a radio frequency sputtering method, etc. A hard coat layer and a under coat layer may be also disposed, if necessary.

(B) Electrode

The transparent electrode may be made of a known material such as tin oxide, ITO (Indium Tin Oxide), IZO (Indium Zinc Oxide), etc. A metal thin film of gold, platinum, etc. may be also used for the transparent electrode. Further, organic materials such as polyaniline, polythiophene, polypyrrole and derivatives thereof may be used therefor. Furthermore, a transparent electrically conductive film described in "Tomei-dodenmaku no Shintenkai (Development of the Transparent Electrically Conductive Film)" (supervised by Yutaka Sawada, CMC, Ink., 1999) may be used as the transparent electrode.

The back electrode is preferably made of a material having a small work function, for example, alkali metals such as Li and K, alkali earth metals such as Mg and Ca, etc. from the viewpoint of electron-injecting properties. Stable materials having high oxidation resistance such as Al are also preferably used for the back electrode. The back electrode may be made of two or more materials to obtain both the excellent electron-injecting properties and high stability (see, Japanese Patent Laid-Open No. 2-15595, Japanese Patent Laid-Open No. 5-121172, etc.).

(C) Hole-Injecting Layer

The hole-injecting material for the hole-injecting layer is not particularly limited, examples thereof including p-type inorganic semiconductors, porphyrin compounds such as copper phthalocyanine, etc., and preferred are p-type inorganic semiconductors. The organic light-emitting device comprising the hole-injecting layer of the p-type inorganic semiconductor can be driven by lowered voltage to improve its durability. Examples of the p-type inorganic semiconductor include $Si_{1-x}C_x$ ($0 \leqq x \leqq 1$), CuI, CuS, GaAs, ZnTe, $Cu_2O$, $Cu_2S$, CuSCN, CuF, CuCl, CuBr, $CuInSe_2$, $CuInS_2$, $CuAlSe_2$, $CuGaSe_2$, $CuGaS_2$, GaP, NiO, CoO, FeO, $Bi_2O_3$, $MoO_2$, $Cr_2O_3$, etc. These p-type inorganic semiconductors may be used singly or as a mixture of a plurality thereof.

(D) Hole-Transporting Layer

Examples of the hole-transporting material for the hole-transporting layer include poly-N-vinylcarbazole derivatives, polyphenylenevinylene derivatives, polyphenylene, polythiophene, polymethylphenylsilane, polyaniline, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives such as phthalocyanine compounds, aromatic tertiary amine compounds, styrylamine compounds, butadiene compounds, benzidine derivatives, polystyrene derivatives, triphenylmethane derivatives, tetraphenylbenzene derivatives, starburst polyamine derivatives etc.

(E) Organic Light-Emitting Layer

The light-emitting material for the organic light-emitting layer is not particularly limited, and any materials that can be excited to emit fluorescence or phosphorescence may be used in the present invention. Examples of the light-emitting material include oxinoid compounds, perylene compounds, coumalin compounds, azacoumalin compounds, oxazole compounds, oxadiazole compounds, perinone compounds, pyrrolopyrrole compounds, biphenyl compounds, naphthalene compounds, anthracene compounds, fluorene compounds, fluoranthene compounds, tetracene compounds, pyrene compounds, coronene compounds, quinolone compounds, azaquinolone compounds, pyrazoline compounds, pyrazolone compounds, rhodamine compounds, chrysene compounds, phenanthrene compounds, cyclopentadiene compounds, stilbene compounds, diphenylquinone compounds, styryl compounds, distyrylbenzene compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, xanthene compounds, thioxanthene compounds, cyanine compounds, acridine compounds, acridone compounds, quinoline compounds, metal complexes containing 8-hydroxyquinoline derivatives, beryllium complexes, containing benzoquinolinol derivatives, metal complexes containing 2,2'-bipyridine derivatives, group III metal complexes containing Schiff base derivatives, metal complexes containing oxadiazole derivatives, rare earth metal complexes, etc. These light-emitting materials may be used singly or together with each other.

Light-emitting polymers are also preferably used as the light-emitting material. Examples of the light-emitting polymer include: π-conjugated polymers such as poly-p-phenylenevinylene, polyfluorene, polythiophene and derivatives thereof; polymers comprising a low molecular weight dye, and tetraphenyldiamine or triphenylamine in main- or side-chain thereof, etc. The light-emitting polymer may be mixed with the low molecular weight light-emitting material mentioned above to be used for the organic light-emitting layer.

With the above-mentioned light-emitting materials may be doped the electron-transporting layer or the hole-transporting layer, to make the layer act as the organic light-emitting layer.

It is particularly preferable that the organic light-emitting layer contains an ortho-metallation complex to improve the light-emitting efficiency of the organic light-emitting device. The ortho-metallation complex-content in the organic light-emitting layer may be selected from large range, and it is, for example, 0.1 to 99 weight %, preferably 1 to 20 weight %.

The ortho-metallation complex used in the present invention may be compounds described in: Akio Yamamoto, "Yukikinzoku-Kagaku, Kiso to Oyo (Metalorganic chemistry, Foundation and Application)", Page 150 to 232, Shokabo Publishing Co., Ltd., (1982); H. Yersin, "Photochemistry and Photophysics of Coordination Compounds", Page 71 to 77 and 135 to 146, Springer-Verlag, Inc. (1987), etc. The ortho-metallation complex contains a particular ligand, which is preferably a 2-phenyl pyridine derivative, a 7,8-benzoquinoline derivative, a 2-(2-thienyl)pyridine derivative, a 2-(1-naphtyl)pyridine derivative or a 2-phenylquinoline derivative. The ortho-metallation complex may contain a ligand other than the particular ligand. Used as a metal contained in the ortho-metallation complex may be Ir, Pd, Pt, etc. Among them, Ir is particularly preferable. The ortho-metallation complex used in the present invention preferably emits light by triplet exciton from the viewpoint of improving the light-emitting efficiency.

(F) Electron-Transporting Layer

Examples of the electron-transporting material for the, electron-transporting layer include oxadiazole derivatives, triazole derivatives, triazine derivatives, nitro-substituted fluorenone derivatives, thiopyran dioxide derivatives, diphenylquinone derivatives, tetracarboxylperylene derivatives, anthraquinodimethane derivatives, fluorenylidenemethane derivatives, anthrone derivatives, perynone derivatives, oxine derivatives, derivatives of quinoline complexes, etc. On the electron-transporting layer is generally disposed the negative electrode. A thin layer made of aluminum oxide, lithium fluoride, etc. having a thickness of approximately 0.01 to 10 nm may be interposed between the electron-transporting layer and the negative electrode.

(G) Electron-Injecting Layer

It is preferable that an insulation thin film is disposed as the electron-injecting layer between the negative electrode and the organic light-emitting layer or the electron-transporting layer. The insulation thin film is preferably such that having a thickness of 0.01 to 10 nm, made of aluminum oxide, lithium fluoride, cesium fluoride, etc.

(H) Electrically Conductive Polymer Layer

When the electrically conductive polymer layer is disposed in the organic light-emitting device, the organic layer can be thickened with little increase of the driving voltage, thereby preventing light-emitting irregularity and short circuit. Preferable as the electrically conductive polymer for use in the electrically conductive polymer layer are polyaniline derivatives, polythiophene derivatives and polypyrrole derivatives described in WO 98/05187, etc. These electrically conductive polymers may be mixed to use with a protonic acid such as camphorsulfonic acid, p-toluenesulfonic acid, styrenesulfonic acid and polystyrenesulfonic acid, and/or the other polymer such as poly (methyl methacrylate) (PMMA), poly(N-vinylcarbazole) (PVCz), etc. The electrically conductive polymer layer preferably has a surface resistance of 10000 Ω/square or less. The thickness of this layer is preferably 10 to 1000 nm, more preferably 20 to 200 nm.

(I) Others

A protective layer described in Japanese Patent Laid-Open No. 7-85974, etc. may be formed on the outer surface of the negative electrode to block moisture and air. Further, it is preferable that the outside of the organic light-emitting device is sealed by a sealant of glass or a poly (chlorotrifluoroethylene) sheet. A desiccating agent, a water repellent fluorine-based inert liquid, etc. may be interposed between the organic light-emitting device and the sealant.

A sealing layer is preferably provided on the organic light-emitting device, to prevent permeation of moisture or oxygen into the device. Examples of a material for the sealing layer include: copolymers of tetrafluoroethylene and at least one comonomer, fluorine-containing copolymers having a cyclic structure in the main chain; polyethylene; polypropylene; poly(methyl methacrylate); polyimides; polyureas; polytetrafluoroethylene; polychlorotrifluoroethylene; polydichlorodifluoroethylene; copolymers of chlorotrifluoroethylene and dichlorodifluoroethylene; a moisture-absorbing substance having a water absorption of 1% or more; a moisture-resistant substance having a water absorption of 0.1% or less; metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AiF_3$ and $CaF_2$; liquid fluorinated carbons such as perfluoroalkanes, perfluoroamines and perfluoroethers; dispersions prepared by adding an adsorbent for adsorbing moisture or oxygen to the liquid fluorinated carbon; etc.

EXAMPLES

The micro-optical resonator type organic light-emitting device of the present invention will be explained in further detail by the following examples without intention of restricting the scope of the present invention defined by the claims attached hereto.

1. Preparation of Laminate Composed of Substrate and Multi-Layered Thin Film

A glass substrate of 5.0 cm×5.0 cm in size was washed with ultrasonic wave in a mixture of acetone, Semico Clean (Furuuchi Kagaku Co.) and isopropyl alcohol (PA). The substrate was further washed by boiling in IPA and treated with $UV/O_3$ washing. This washed substrate was then placed in an EB metallizing chamber, and a multi-layered thin film, which has the reflectivity of 60% against each light in the wavelength range 1 (530 to 550 nm), the wavelength range 2 (590 to 640 nm) and the wavelength range 3 (660 to 780 nm), was disposed thereon, to obtain the comparative laminate A composed of the substrate and the multi-layered thin film.

The above steps for preparing the comparative laminate A was repeated except for changing the reflectivity into such that shown in Table 1, to obtain the comparative laminates B and C, and the laminates D to J usable for the micro-optical resonator type organic light-emitting device of the present invention. Incidentally, the multi-layered thin film of each laminate A to J was made of two materials selected from $SiO_2$, $TiO_2$, $Al_2O_3$ and $ZrO_2$. The number of layers composing the multi-layered thin film is also shown in Table 1.

TABLE 1

| | Reflectivity of Multi-Layered Thin Film (%) | | | |
|---|---|---|---|---|
| Laminate | Wavelength Range 1 (530 to 550 nm) | Wavelength Range 2 (590 to 640 nm) | Wavelength Range 3 (650 to 780 nm) | Number of Layers |
| A | 60 | 60 | 60 | 6 |
| B | 80 | 80 | 80 | 8 |
| C | 90 | 90 | 90 | 12 |
| D | 60 | 30 | 30 | 12 |
| E | 60 | 30 | 60 | 20 |
| F | 60 | 10 | 10 | 26 |
| G | 80 | 30 | 30 | 22 |
| H | 80 | 10 | 10 | 28 |
| I | 90 | 30 | 30 | 26 |
| J | 90 | 10 | 10 | 32 |

2. Production of Micro-Optical Resonator Type Organic Light-Emitting Device

The laminate A mentioned above was placed in a sputtering chamber, and ITO was sputtered thereon to obtain an ITO transparent electrode having thickness of 0.04 μm. On thus-obtained ITO electrode was vapor-deposited 4,4'-bis [N-(1-naphtyl)-N-phenylamino]biphenyl (NPD) at a rate of 3 to 4 Å/second to thickness of 400 Å as a hole-transporting layer, and thereon was further vapor-deposited the com pound 1 shown below at a rate of 3 to 4 Å/second to thickness of 200 Å as a light-emitting layer.

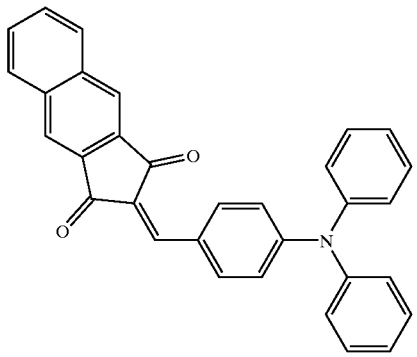

On the obtained light-emitting layer was vapor-deposited tris(8-hydroxyquinoline) aluminum (Alq) at a rate of 3 to 6 Å/second to thickness of 400 Å as an electron-transporting layer. Then, a negative electrode having thickness of 0.6 μm was disposed on the electron-transporting layer by vapor-depositing Mg-Ag alloy (mole ratio: Mg/Ag=10/1), and on the negative electrode was further vapor-deposited Ag to a 0.5 μm thickness, to produce the micro-optical resonator type, organic green light-emitting device of Comparative Example 1. Incidentally, optical length of the device was three times as long as half of wavelength of 540 nm.

The micro-optical resonator type, organic green light-emitting devices of Examples 1 to 21 and Comparative Examples 2 to 9 were each produced in the same manner as Comparative Example 1 except that the laminate and the thickness of the ITO electrode were changed as shown in Table 2. Incidentally, the optical length of each device was three, four or five times as long as half of wavelength of 540 nm. The surface resistance of the ITO electrode is also shown in Table 2 with respect to each device.

TABLE 2

| Organic Light-Emitting Device | Laminate | Thickness of ITO Electrode (μm) | Surface Resistance of ITO Electrode (Ω/square) |
| --- | --- | --- | --- |
| Comp. Ex. 1 | A | 0.04 | 98 |
| Comp. Ex. 2 | A | 0.18 | 49 |
| Comp. Ex. 3 | A | 0.32 | 7.2 |
| Comp. Ex. 4 | B | 0.04 | 98 |
| Comp. Ex. 5 | B | 0.18 | 49 |
| Comp. Ex. 6 | B | 0.32 | 7.2 |
| Comp. Ex. 7 | C | 0.04 | 98 |
| Comp. Ex. 8 | C | 0.18 | 49 |
| Comp. Ex. 9 | C | 0.32 | 7.2 |
| Ex. 1 | D | 0.04 | 98 |
| Ex. 2 | D | 0.18 | 49 |
| Ex. 3 | D | 0.32 | 7.2 |
| Ex. 4 | E | 0.04 | 98 |
| Ex. 5 | E | 0.18 | 49 |
| Ex. 6 | E | 0.32 | 7.2 |
| Ex. 7 | F | 0.04 | 98 |
| Ex. 8 | F | 0.18 | 49 |
| Ex. 9 | F | 0.32 | 7.2 |
| Ex. 10 | G | 0.04 | 98 |
| Ex. 11 | G | 0.18 | 49 |
| Ex. 12 | G | 0.32 | 7.2 |
| Ex. 13 | H | 0.04 | 98 |
| Ex. 14 | H | 0.18 | 49 |
| Ex. 15 | H | 0.32 | 7.2 |
| Ex. 16 | I | 0.04 | 98 |
| Ex. 17 | I | 0.18 | 49 |
| Ex. 18 | I | 0.32 | 7.2 |
| Ex. 19 | J | 0.04 | 98 |

TABLE 2-continued

| Organic Light-Emitting Device | Laminate | Thickness of ITO Electrode (μm) | Surface Resistance of ITO Electrode (Ω/square) |
| --- | --- | --- | --- |
| Ex. 20 | J | 0.18 | 49 |
| Ex. 21 | J | 0.32 | 7.2 |

3. Measurement of Light-Emitting Spectra

Each micro-optical resonator type, organic green light-emitting device mentioned above was measured with respect to light-emitting spectra, and the light intensity ratio of each of the first mode light and the second mode light to the 0-mode light (first mode light intensity/0-mode light intensity and second mode light intensity/0-mode light intensity) was found. The results are shown in Table 3. Incidentally, each device was made to emit light with a uniform luminance.

TABLE 3

| Organic Light-Emitting Device | First Mode Light Intensity/0-Mode Light Intensity | Second Mode Light Intensity/0-Mode Light Intensity |
| --- | --- | --- |
| Comp. Ex. 1 | 0.1 | 0.02 |
| Comp. Ex. 2 | 0.2 | 0.04 |
| Comp. Ex. 3 | 0.4 | 0.08 |
| Comp. Ex. 4 | 0.1 | 0.03 |
| Comp. Ex. 5 | 0.2 | 0.04 |
| Comp. Ex. 6 | 0.3 | 0.09 |
| Comp. Ex. 7 | 0.1 | 0.03 |
| Comp. Ex. 8 | 0.2 | 0.04 |
| Comp. Ex. 9 | 0.5 | 0.08 |
| Ex. 1 | Not Found | Not Found |
| Ex. 2 | Not Found | Not Found |
| Ex. 3 | Not Found | Not Found |
| Ex. 4 | Not Found | 0.02 |
| Ex. 5 | Not Found | 0.04 |
| Ex. 6 | Not Found | 0.08 |
| Ex. 7 | Not Found | Not Found |
| Ex. 8 | Not Found | Not Found |
| Ex. 9 | Not Found | Not Found |
| Ex. 10 | Not Found | Not Found |
| Ex. 11 | Not Found | Not Found |
| Ex. 12 | Not Found | Not Found |
| Ex. 13 | Not Found | Not Found |
| Ex. 14 | Not Found | Not Found |
| Ex. 15 | Not Found | Not Found |
| Ex. 16 | Not Found | Not Found |
| Ex. 17 | Not Found | Not Found |
| Ex. 18 | Not Found | Not Found |
| Ex. 19 | Not Found | Not Found |
| Ex. 20 | Not Found | Not Found |
| Ex. 21 | Not Found | Not Found |

As shown in Table 3, the micro-optical resonator type, organic green light-emitting devices of the present invention according to Examples 1 to 21 emit less high mode light than that of each device according to Comparative Examples 1 to 9. Further, when the organic light-emitting devices that provide blue or red light were produced and measured with respect to the light-emitting spectra in the same manner as above, the results of the measurement were the same as the case of the organic green light-emitting devices mentioned above.

As described in detail above, the micro-optical resonator type organic light-emitting device of the present invention scarcely causes multi mode resonance even if the optical length thereof is increased by thickening a transparent electrode.

What is claimed is:
1. A micro-optical resonator type organic light-emitting device comprising a substrate, a multi-layered thin film, a transparent electrode, an organic light-emitting layer and a back electrode disposed on said substrate, wherein if 0-mode resonance wavelength of said micro-optical resonator type organic light-emitting device is expressed by $\lambda_0$, n-mode resonance wavelength of said micro-optical resonator type organic light-emitting device is expressed by $\lambda_n$ (in which n is a positive integer) and reflectivity of said multi-layered thin film against light having a wavelength A is expressed by $R(\lambda)$, $R(\lambda_0)$ is 40% or more and at least one of $R(\lambda_1)$ and $R(\lambda_2)$ is 30% or less.

2. The micro-optical resonator type organic light-emitting device according to claim 1, wherein said $R(\lambda_0)$ is 60% or more.

3. The micro-optical resonator type organic light-emitting device according to claim 2, wherein said $R(\lambda_0)$ is 80% or more.

4. The micro-optical resonator type organic light-emitting device according to claim 1, wherein said $R(\lambda_1)$ and $R(\lambda_2)$ is 30% or less.

5. The micro-optical resonator type organic light-emitting device according to claim 1, wherein said at least one of $R(\lambda_1)$ and $R(\lambda_2)$ is 20% or less.

6. The micro-optical resonator type organic light-emitting device according to claim 5, wherein said $R(\lambda_1)$ and $R(\lambda_2)$ is 20% or less.

7. The micro-optical resonator type organic light-emitting device according to claim 1, wherein said at least one of $R(\lambda_1)$ and $R(\lambda_2)$ is 10% or less.

8. The micro-optical resonator type organic light-emitting device according to claim 7, wherein said $R(\lambda_1)$ and $R(\lambda_2)$ is 10% or less.

9. The micro-optical resonator type organic light-emitting device according to claim 1, wherein said multi-layered thin film is made of one or more material selected from the group consisting of $SiO_2$, $TiO_2$, $Al_2O_3$, $MgF_2$ and $ZrO_2$.

10. The micro-optical resonator type organic light-emitting device according to claim 1, wherein said multi-layered thin film is composed of eight or more layers.

11. The micro-optical resonator type organic light-emitting device according to claim 1, wherein optical length of said micro-optical resonator type organic light-emitting device is four times or more as long as half of said wavelength $\lambda_0$.

12. The micro-optical resonator type organic light-emitting device according to claim 1, wherein said transparent electrode has surface resistance of 50 $\Omega$/square or less.

13. The micro-optical resonator type organic light-emitting device according to claim 1, wherein said transparent electrode has thickness of 40 nm or more.

14. The micro-optical resonator type organic light-emitting device according to claim 13, wherein said transparent electrode has thickness of 80 nm or more.

15. The micro-optical resonator type organic light-emitting device according to claim 14, wherein said transparent electrode has a thickness of 150 nm or more.

16. The micro-optical resonator type organic light-emitting device according to claim 15, wherein said transparent electrode has a thickness of 250 nm or more.

17. The micro-optical resonator type organic light-emitting device according to claim 1, further comprising an electron-transporting layer between said organic light-emitting layer and said back electrode.

18. The micro-optical resonator type organic light-emitting device according to claim 17, further comprising a hole-transporting layer between said transparent electrode and said organic light-emitting layer.

19. The micro-optical resonator type organic light-emitting device according to claim 1, wherein said organic light-emitting layer comprises an ortho-metallation complex.

20. The micro-optical resonator type organic light-emitting device according to claim 19, wherein said ortho-metallation complex is used in an amount of from 0.1 to 99 weight %.

21. The micro-optical resonator type organic light-emitting device according to claim 1, wherein said micro-optical resonator is provided by disposing said organic light-emitting layer between said multi-layered thin film and said back electrode, and wherein said micro-optical resonator has a resonance wavelength.

* * * * *